United States Patent
Steele et al.

(10) Patent No.: US 7,095,228 B2
(45) Date of Patent: Aug. 22, 2006

(54) SENSOR SYSTEM AND METHOD FOR OPERATING THE SENSOR SYSTEM

(75) Inventors: Colin Steele, Söding (AT); Siegfried Rossmann, Kuehnsdorf (AT); Frank Perske, Graz (AT)

(73) Assignee: Austriamicrosystems AG, Unterpremstatten (AT)

( * ) Notice: Subject to any disclaimer, the term of this patent is extended or adjusted under 35 U.S.C. 154(b) by 0 days.

(21) Appl. No.: 10/501,633

(22) PCT Filed: Dec. 18, 2002

(86) PCT No.: PCT/EP02/14508

§ 371 (c)(1),
(2), (4) Date: Jul. 15, 2004

(87) PCT Pub. No.: WO03/060537

PCT Pub. Date: Jul. 24, 2003

(65) Prior Publication Data

US 2005/0088170 A1    Apr. 28, 2005

(30) Foreign Application Priority Data

Jan. 18, 2002  (DE) ................................ 102 01 875

(51) Int. Cl.
*G01R 33/07* (2006.01)
(52) U.S. Cl. .................................... 324/251; 324/207.2
(58) Field of Classification Search ................ 324/251, 324/207.2
See application file for complete search history.

(56) References Cited

U.S. PATENT DOCUMENTS

| | | | |
|---|---|---|---|
| 4,599,564 A | 7/1986 | Kelleher et al. | |
| 4,668,914 A | 5/1987 | Kersten et al. | |
| 5,406,202 A * | 4/1995 | Mehrgardt et al. | 324/251 |
| 5,621,319 A | 4/1997 | Bilotti et al. | |
| 5,747,995 A | 5/1998 | Spies | |
| 5,844,427 A | 12/1998 | Theus et al. | |
| 6,861,839 B1 * | 3/2005 | Hara et al. | 324/251 |

FOREIGN PATENT DOCUMENTS

| DE | 199 43 128 | 4/2001 |
|---|---|---|
| WO | WO01/18556 | 3/2001 |

OTHER PUBLICATIONS

Translation of the International Preliminary Examination Report for Application. PCT/EP2002/014508, dated Nov. 4, 2004.

* cited by examiner

*Primary Examiner*—Reena Aurora
(74) *Attorney, Agent, or Firm*—Fish & Richardson P.C.

(57) ABSTRACT

A system includes plural sensors to detect at least one of a magnetic field and an electrical field, where each of the plural sensors includes outputs that output sensor signals when a field is detected. Plural signal modulators receive sense signals that correspond to sensor signals from corresponding ones of the plural sensors. Each of the plural signal modulators has first and second control states. In the first control state, each signal modulator outputs sense signals, and, in the second control state, each signal modulator outputs inverted sense signals. A device receives and processes the sense signals or the inverted sense signals.

13 Claims, 3 Drawing Sheets

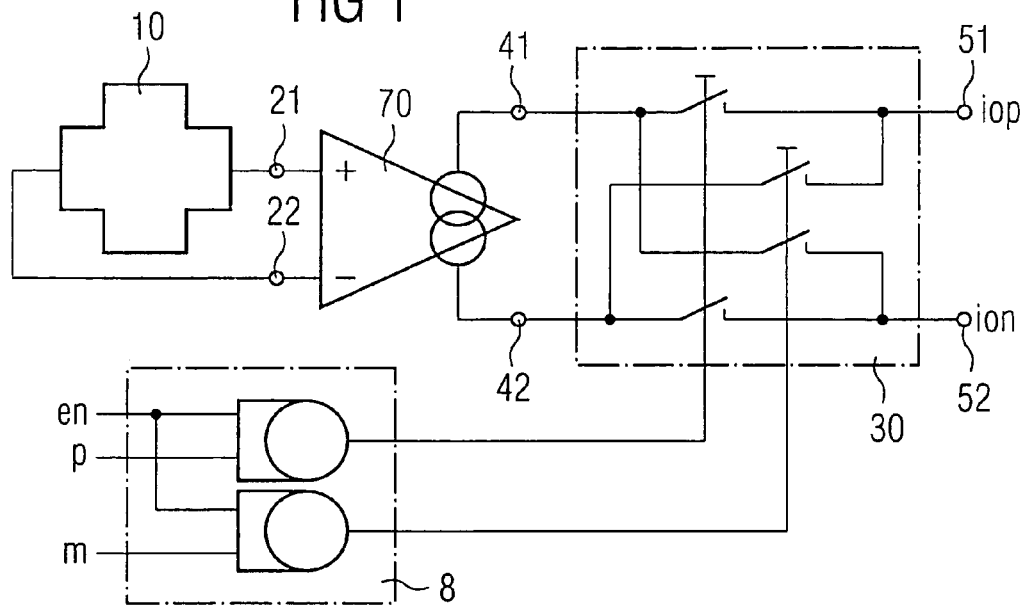
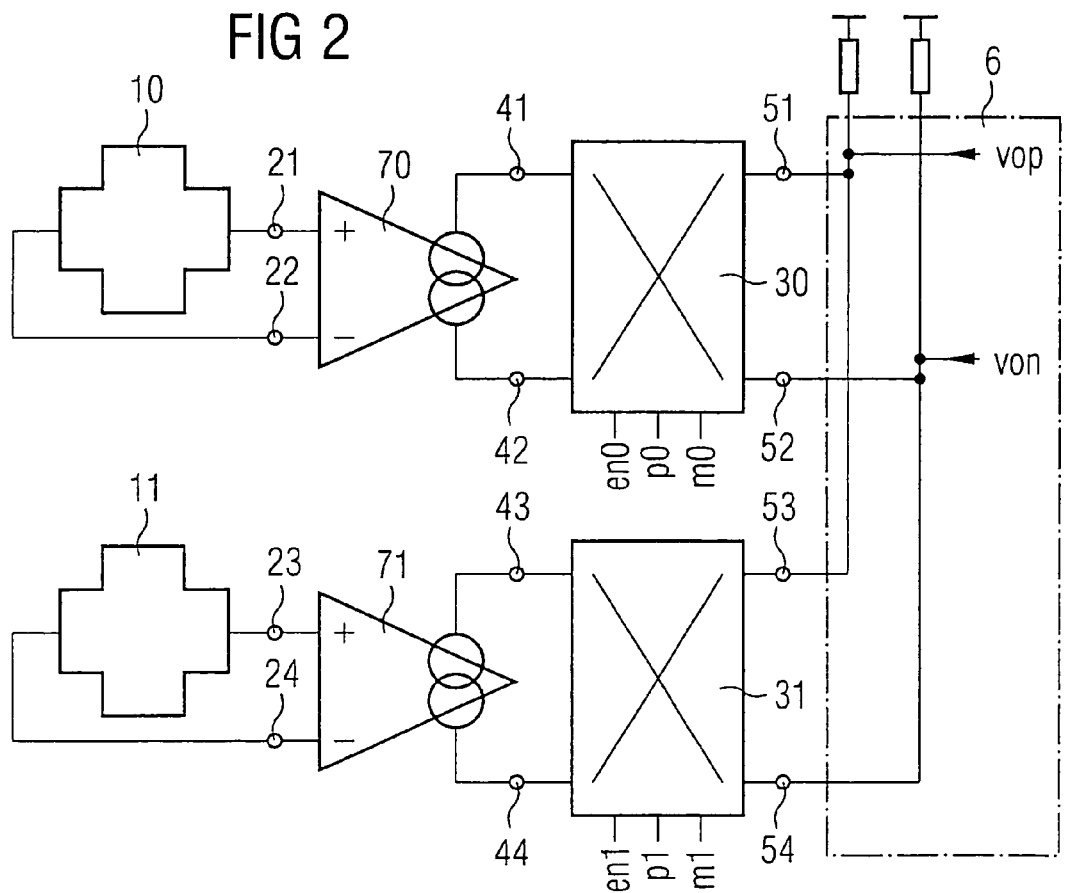

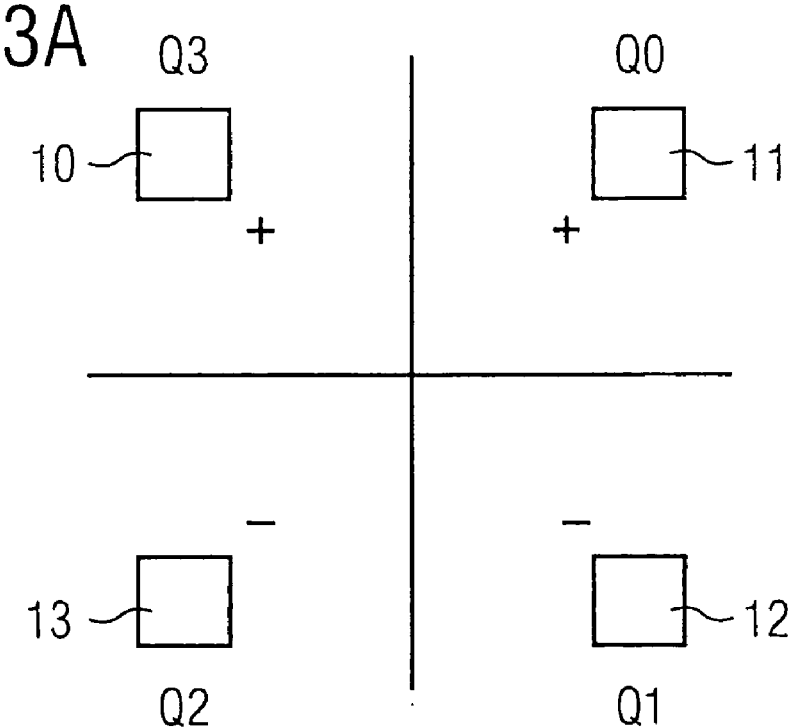
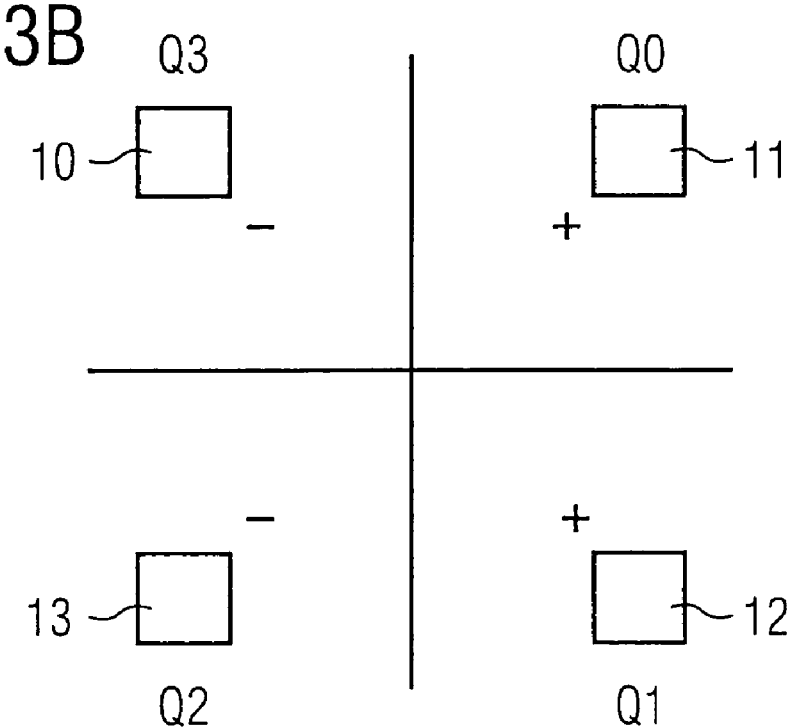

SENSOR SYSTEM AND METHOD FOR OPERATING THE SENSOR SYSTEM

TECHNICAL FIELD

The invention relates to a sensor system with an arrangement of sensors in which each sensor detects an electric or magnetic field and outputs an electric sensor signal to its sensor outputs. The sensor outputs are connected to one another. In addition, the invention relates to a method to operate the sensor system.

BACKGROUND

A Hall sensor arrangement, in which several Hall sensors are arranged in a stationary manner and in a fixed configuration with one other, is known from the reference DE 199 43 128 A1. This type of sensor arrangement has the disadvantage that it has low flexibility in measuring magnetic fields, for example, because of a fixed connection of the sensors. In particular, the known sensor arrangement is not suitable for the two-dimensional and three-dimensional measurement of magnetic field distributions.

SUMMARY

As a result, the objective of the present invention is disclosing a sensor system that has a plurality of applications and that is suitable for analyzing two-dimensional and three-dimensional magnetic field distributions.

A sensor system is disclosed that has an arrangement of sensors. Each of the sensors detects an electric or magnetic field and outputs an electric sensor signal to its outputs. The same types of sensors but also different types of sensors can be used for the sensor system.

Each of the sensors is connected to a signal modulator, wherein the inputs of the signal modulator are connected to the sensor outputs of the related sensor. Each signal modulator has at least two control states. In a first control state, the corresponding basic sensor signal is fed to the signal modulator output as a sensor end signal. In a second control state, the inverted basic sensor signal is fed to the signal modulator output as a sensor end signal.

In addition, the sensor system features a device for the addition of the sensor end signals to a system signal.

The advantage of the sensor system is that a plurality of configurations can be defined for the sensor system because of the different control states of each signal modulator. As a result, the sensor system can be used flexibly and, in particular, to analyze two-dimensional and three-dimensional magnetic fields. In addition, such a sensor system is suitable for detecting linear, magnetic or electrical fields, and for detecting locational displacements of linear or axial, sinusoidally-distributed magnetic fields.

In addition, a method to operate the sensor system that is made possible for the first time with the sensor system in accordance with the invention is disclosed. In this arrangement, all control states of the signal modulators together define the configuration of the sensor system. The operating method features the following steps:

In a first step, the sensor system is put into a first configuration. A suitable device detects and stores the system signal output by the sensor system.

In a second step of the operating method, the sensor system's configuration is modified from the first configuration to the second configuration. In this arrangement, the second configuration differs from the first configuration.

In a third step, the system signal output by the sensor system in the second configuration is in turn read in and stored in a suitable device.

If necessary, yet other configurations can be set and the signals output by the sensor system can be read in and stored.

Finally, in a further method step, an arithmetic operation is performed with the first and second and any additional system signals. This arithmetic operation can be used to draw conclusions about the two-dimensional or spatial distribution of the magnetic or electrical field being detected.

Hall sensors, for example, can be used as the sensors in the sensor system. These types of Hall sensors can be designed as vertical or lateral Hall sensors on the basis of silicon sensors. But magnetic-field-dependent resistors can also be considered as sensors.

An operational transconductance amplifier can amplify the basic sensor signals output by the Hall sensors. This operational transconductance amplifier is then connected between each sensor and the corresponding signal modulator. The use of operational transconductance amplifiers to amplify the basic sensor signals makes it possible to connect, in parallel, individual sensor units comprised of a sensor and the associated signal modulator. This type of parallel connection makes it possible to add up currents of the sensor end signals to a system signal.

The signal modulators can be connected with a control logic circuit, which allows the switchover between two control states of a signal modulator to be realized via digital control words. This allows particularly quick switching between two control states of a signal modulator and therefore between two configurations of the sensor system.

In an exemplary embodiment of the sensor system, the sensors can be arranged in a plane. Within such a plane, the sensors can in turn be arranged in rows and columns, which are orthogonal to one another. As a result, a checkerboard-like grid of sensors is realized.

DESCRIPTION OF THE DRAWINGS

The invention is described in greater detail in the following on the basis of exemplary embodiments and the associated figures.

FIG. 1 shows a component of a sensor system in a schematic circuitry arrangement.

FIG. 2 shows an example of a sensor system in accordance with the invention in a schematic circuitry arrangement.

FIG. 3A shows a first configuration of a sensor system in accordance with the invention.

FIG. 3B shows another configuration of the sensor system from FIG. 3A.

DETAILED DESCRIPTION

Figure 4A:
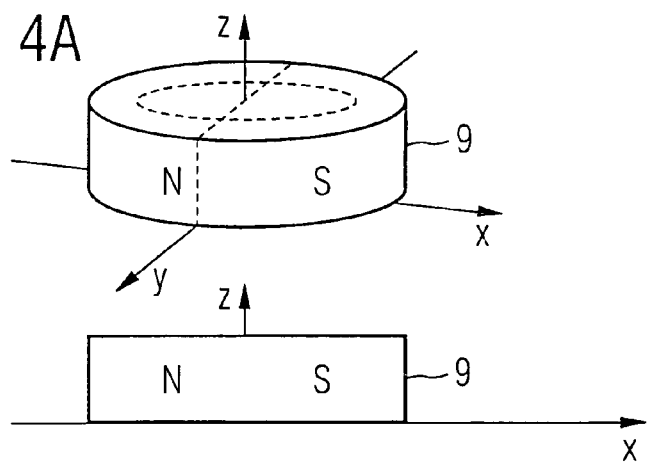
FIG. 4A shows a cylindrical permanent magnet whose orientation is determined relative to the sensor system from FIGS. 3A and 3B.

FIG. 1 shows a Hall sensor 10 whose outputs 21, 22 are connected to an operational transconductance amplifier 70.

The outputs of the operational transconductance amplifier 70 are in turn connected to the inputs 41, 42 of a signal modulator 30. The sensor end signal iop, ion is fed to the outputs 51, 52 of the signal modulator 30. The output modulator 30 is connected to a control logic circuit 8, which can create the various control states in the signal modulator 30. To do this, digital signals are fed to the inputs EN, P, M of the control logic circuit 8 and these digital signals can be summarized as digital control words. In this arrangement, the input EN of the control logic circuit 8 stands for turning on the signal modulator 30. As soon as the signal "high" is fed to the input EN of the control logic circuit 8, the signal modulator 30 supplies a signal to its outputs 51, 52 that is a function of the signal from the Hall sensor 10. If the signal "low" is fed to the input EN of the control logic circuit 8, the signal modulator 30 is deactivated, i.e., the outputs 51, 52 of the signal modulator 30 are not connected to the sensor outputs 21, 22 of the Hall sensor 10. When the signal modulator 30 is activated, there is the possibility of receiving either the basic sensor signal of the Hall sensor 10 or the inverted basic signal of the Hall sensor 10 at the outputs 51, 52 of the signal modulators 30 via feeding corresponding signals to the inputs P, M of the control logic circuit 8. To do this, the signal "high" must be fed just to input P or the signal "high" to input M.

Overall, the signal modulator 30 in FIG. 1 has three different control states. These control states are characterized by 0 (signal modulator 30 deactivated),+(addition, i.e., the sensor end signal iop, ion corresponds to the basic sensor signal) and−(i.e., the sensor end signal represents the inverted basic sensor signal).

FIG. 2 shows the connection of two sensors 10 from FIG. 1 to a sensor system. Each sensor 10, 11 is allocated to a signal modulator 30, 31, which is connected to the corresponding sensor 10, 11 via an operational transconductance amplifier 70, 71. The sensor outputs 21, 22 of the sensor 10 or the sensor outputs 23, 24 of the sensor 11 are connected to the sensor inputs 41, 42 of the signal modulator 30 or the inputs 43, 44 of the signal modulator 31. Sensor end signals are fed to the outputs 51, 52 or 53, 54 of the signal modulators 30, 31 and these signals are summed up for addition via the device 6.

According to FIG. 2, the device 6 for addition is a simple parallel circuit of the output voltages being fed to the outputs 51, 52 or 53, 54 of the signal modulators 30 or 31. With respect to the currents measured in this case, an addition of the sensor end signals is produced. The summed currents generate a voltage drop at the resistors 91, 92, which can be read out as the system signal VOP, VON.

The signal modulators 30, 31 each contain a control logic circuit, which is not shown in FIG. 2, however. Only the inputs of the control logic circuits with EN0, P0, M0 for the signal modulator 30 or EN1, P1, M1 for signal modulator 31 are indicated.

FIG. 3 shows the arrangement of four sensors 10, 11, 12, 13 in a square pattern, wherein the surface is divided into quadrants Q0, Q1, Q2, Q3. One of the sensors 10, 11, 12, 13 is located in each quadrant Q0, Q1, Q2, Q3. The configuration of the sensor system from FIG. 3A is indicated by the + symbol in quadrants Q0, Q3 and by the − symbol in quadrants Q2, Q1. According to FIG. 3B, the sensor system from FIG. 3A has a different configuration, wherein the + symbol applies to quadrants Q1 and Q0 and by the − symbol to quadrants Q2 and Q3. The + or − symbols indicate the control state of the sensor 10, 11, 12, 13 located in the respective quadrant Q0, Q1, Q2, Q3. Using a sensor system in two different configurations K1 and K2 according to FIGS. 3A and 3B, the rotational angle of a magnet according to FIG. 4A, for example, can be measured via the sensor arrangement.

FIG. 4A shows a cylindrical permanent magnet whose orientation is determined relative to the sensor system from FIGS. 3A and 3B.

Such a magnet 9 is depicted in FIG. 4A. It has the shape of a disk, which possesses an axis of symmetry along the Z-axis. Both halves of the disk are diametrically magnetized and consequently feature a magnetic north pole N and a magnetic south pole S.

Figure 4B:
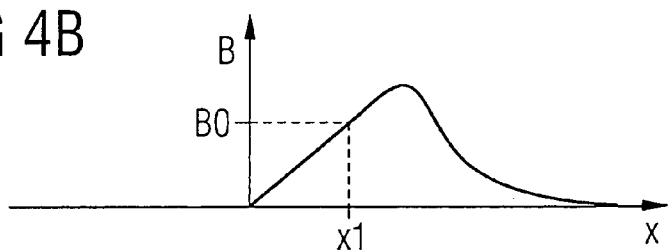
FIG. 4B shows the tangential magnetic field amplitude on the X-axis of the magnet from FIG. 4A along centric circles with the radius X about the axis of symmetry.

FIG. 4B shows the tangential component of the magnetic field with respect to circles about the axis of symmetry Z as magnetic field amplitude B, wherein the magnetic field is applied at the intersection point of a circle with the X-axis. For a circle with radius X1, the tangential component of the magnetic field has magnetic field amplitude B0.

Figure 4C:
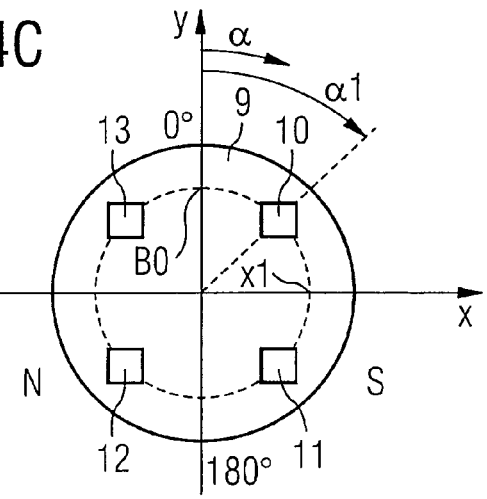
FIG. 4C shows a top view of the relative position of a sensor system in accordance with FIG. 3A to a magnet in accordance with FIG. 4A.

FIG. 4C shows a top view of the arrangement of a magnet 9 in accordance with FIG. 4A over a sensor system according to FIG. 3A. The sensors 10, 11, 12, 13 lie on a circle around the axis of symmetry Z of the magnet 9, wherein the radius of the circle is X1. The axis of symmetry Z of the magnet 9, the sensor 10 and the Y-axis of the magnetic 9 enclose angle α1. The angle α1 is 45°.

Figure 4D:
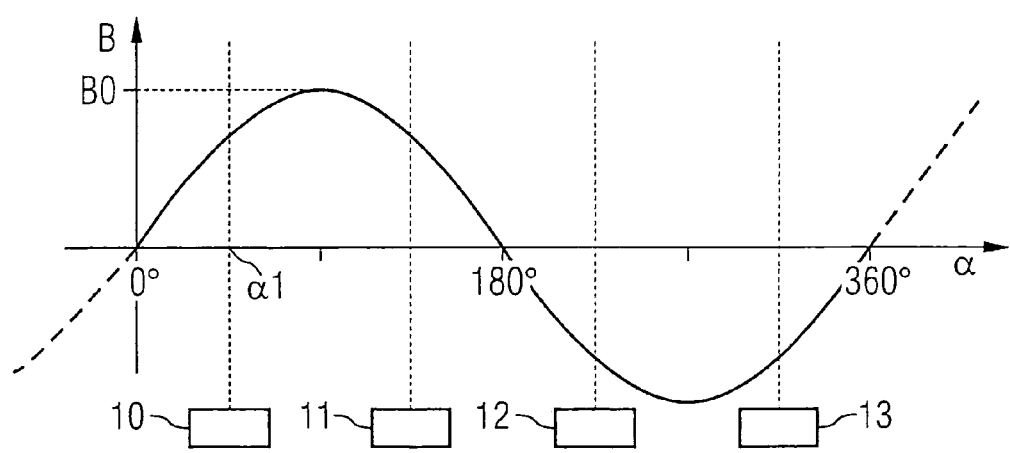
FIG. 4D shows the tangential magnetic field amplitude.

FIG. 4D shows, as a function of angle a from FIG. 4C, the tangential magnetic field amplitude B along the circle with the radius x1 according to FIG. 4C. The position of the sensors 10, 11, 12, 13 is indicated in FIG. 4D. The maximum value of the magnetic field amplitude is produced for a α=90°. In this case, the magnetic field amplitude has the value B0. The magnet 9 can now be rotated according to FIG. 4C, in the direction of the arrow, vis-à-vis the sensor arrangement. If one designates the rotational angle of the magnet 9 vis-à-vis the sensors system as α, then when $G_{Hall}$=the electric amplification of the Hall sensors the following relations are produced:

The magnetic source field $B_{source}$ at the location of each sensor 10, 11, 12, 13 is determined by the rotational angle α in accordance with:

$$B_{source} = B0 \cdot \sin(\alpha).$$

In the configuration according to FIG. 3A, the following is obtained as the system signal $V_{K1}$:

$$V_{K1} = B0 \cdot G_{Hall} \cdot ((\sin(\alpha+45) - \sin(\alpha+135) - \sin(\alpha+225) + \sin(\alpha+315)))$$

The following is yielded by transformation:

$$V_{K1} = 2\sqrt{2} \cdot B0 \, G_{Hall} \cdot \sin(\alpha).$$

Another signal is obtained with the configuration of the sensor system according to FIG. 3B:

$$V_{K2} = B0 \cdot G_{Hall} \cdot ((\sin(\alpha+45) - \sin(\alpha+135) - \sin(\alpha+225) + \sin(\alpha+315)))$$

Transformation yields:

$$V_{K2} = 2\sqrt{2} \cdot B0 \cdot G_{Hall} \cdot \cos(\alpha).$$

The rotational angle of magnet 9 vis-àvis the sensor system can be computed in a simple manner from signals $V_{k1}$ and $V_{k2}$ using an arithmetic operation. To do so, the following is calculated:

$$\alpha = \text{ARC TAN}(V_{K2} : V_{K2})$$

This calculation can be performed, for example, using the method in accordance with the invention by the sensor system measuring at a first point in time in a configuration K1 and the measured value of the system signal (VOP, VON) being stored. Then, as seen in FIGS. 3A and 3B, the sensor system is put into another configuration K2. Then the system signal VOP, VON is again recorded and stored. Finally, the arithmetic operation indicated above is performed.

Because of the possibility of controlling the signal modulators via digital control words, the switchover between different configurations K1, K2 of the sensor system can take place in a very short time, for example at intervals of several μs. As a result, this guarantees that the sensor system has a high level of flexibility and great speed.

The invention claimed is:

1. A system comprising:
 a first sensor to detect at least one of a magnetic field and an electrical field, the first sensor comprising first outputs to output first sensor signals when a field is detected;
 a first signal modulator to receive first sense signals that correspond to the first sensor signals from the first sensor, the first signal modulator having first and second control states, wherein in the first control state, the first signal modulator is configured to output the first sense signals, and, wherein in the second control state, the first signal modulator is configured to output inverted first sense signals;
 a device configured to receive and process the first sense signals or the inverted first sense signals;
 a second sensor to detect at least one of a magnetic field and an electrical field, the second sensor comprising second outputs to output second sensor signals when a field is detected; and
 a second signal modulator to receive second sense signals that correspond to the second sensor signals from the second sensor, the second signal modulator having the first and second control states, wherein in the first control state, the second signal modulator is configured to output the second sense signals, and, wherein in the second control state, the second signal modulator is configured to output inverted second sense signals;
 wherein the device is configured to receive and process the second sense signals or the inverted second sense signals.

2. The system of claim 1, wherein the first sensor and the second sensor comprise Hall sensors.

3. The system of claim 2, wherein the Hall sensors comprise silicon sensors.

4. The system of claim 1, further comprising:
 a first operational transconductance amplifier between the first sensor and the first signal modulator, the first operational transconductance amplifier to generate the first sense signals from the first sensor signals; and
 a second operational transconductance amplifier between the second sensor and the second signal modulator, the second operational transconductance amplifier to generate the second sense signals from the second sensor signals.

5. The system of claim 1, wherein the first signal modulator and the second signal modulator are connected in parallel.

6. The system of claim 1, further comprising:
 a first control logic circuit in communication with the first signal modulator; and
 a second control logic circuit in communication with the second signal modulator.

7. The system of claim 6, wherein the first and the second signal modulators are controlled by a digital control word input to corresponding ones of the first and second control logic circuits.

8. The system of claim 1, wherein the first sensor and the second sensor are arranged in a plane.

9. A method of operating a system comprised of:
 plural sensors to detect at least one of a magnetic field and an electrical field, each of the plural sensors comprising outputs to output sensor signals when a field is detected;
 plural signal modulators to receive sense signals that correspond to sensor signals from corresponding ones of the plural sensors, each of the plural signal modulators having first and second control states, wherein in the first control state, each signal modulator is configured to output sense signals, and, wherein in the second control state, each signal modulator is configured to output inverted sense signals; and
 a device to receive and process the sense signals or the inverted sense signals, the method comprising:
 reading and storing a first system signal from the device in a case that the system is in a first configuration;
 changing a configuration of the system to a second configuration that is different from the first configuration;
 reading and storing a second system signal from the device when the system is in the second configuration; and
 performing an arithmetic operation using the first system signal and the second system signal.

10. The method of claim 9, wherein after reading and storing the second system signal but before performing the arithmetic operation, the method further comprises:
 changing a configuration of the system and reading and storing additional system signals corresponding to changes in the configuration of the system;
 wherein the arithmetic operation is performed using the additional system signals.

11. The system of claim 1, further comprising:
 plural sensors to detect at least one of a magnetic field and an electrical field, each of the plural sensors comprising outputs to output sensor signals when a field is detected;
 plural signal modulators to receive sense signals that correspond to sensor signals from corresponding ones of the plural sensors, each of the plural signal modulators having the first and second control states, wherein in the first control state, each signal modulator is configured to output sense signals, and, wherein in the second control state, each signal modulator is configured to output inverted sense signals;
 wherein the device is configured to receive and process the sense signals or the inverted sense signals.

12. The system of claim 11, wherein the first sensor, the second sensor, and the plural sensors are arranged in rows and columns that are orthogonal.

13. The method of claim 9, wherein performing the arithmetic operation comprises using a trigonometric function.

* * * * *